United States Patent [19]
Chang

[11] Patent Number: 5,434,098
[45] Date of Patent: Jul. 18, 1995

[54] DOUBLE POLY PROCESS WITH INDEPENDENTLY ADJUSTABLE INTERPOLY DIELECTRIC THICKNESS

[75] Inventor: Kuang-Yeh Chang, Los Gatos, Calif.

[73] Assignee: VLSI Techology, Inc., San Jose, Calif.

[21] Appl. No.: 253,327

[22] Filed: Jun. 3, 1994

Related U.S. Application Data

[63] Continuation of Ser. No. 440, Jan. 4, 1993, abandoned.

[51] Int. Cl.$^6$ ............................................. H01L 21/8238
[52] U.S. Cl. ....................................... 437/60; 437/56; 437/919
[58] Field of Search ................... 437/47, 48, 52, 56, 437/57, 60, 235, 238, 919

[56] References Cited

U.S. PATENT DOCUMENTS

| | | | |
|---|---|---|---|
| 4,419,812 | 12/1983 | Topich | 437/47 |
| 4,494,301 | 1/1985 | Faraone | 437/238 |
| 4,577,390 | 3/1986 | Haken | 437/919 |
| 4,639,274 | 1/1987 | Krishna | 437/60 |
| 4,735,915 | 4/1988 | Kita et al. | 437/60 |
| 4,987,091 | 1/1991 | Kotaki | 437/919 |
| 5,104,819 | 4/1992 | Freiberger et al. | 437/43 |
| 5,223,451 | 6/1993 | Uemura et al. | 437/34 |

FOREIGN PATENT DOCUMENTS

| | | | |
|---|---|---|---|
| 0113323 | 9/1980 | Japan | 437/52 |
| 0065452 | 4/1984 | Japan | 437/919 |
| 0114240 | 5/1987 | Japan | 437/919 |

Primary Examiner—Tom Thomas
Attorney, Agent, or Firm—Burns, Doane, Swecker & Mathis

[57] ABSTRACT

The present invention relates to a double poly MOS structure and a method for polysilicon capacitor formation which allows for independent adjustment of an interpoly oxide layer without affecting thickness of the gate oxide layer. In an exemplary embodiment, a first oxide layer is formed above a polysilicon layer. A second oxide layer is subsequently formed on the substrate to establish a gate oxide in an active area of the transistor. As a result, the interpoly oxide layer is formed by a combination of the first and second oxide formations, while the gate oxide layer is formed by only the second oxide formation. Thus, the thickness of the interpoly oxide layer can be adjusted by increasing or decreasing the thickness of the first oxide formation without changing the thickness of the gate oxide layer.

18 Claims, 4 Drawing Sheets

DOUBLE POLY PROCESS WITH INDEPENDENTLY ADJUSTABLE INTERPOLY DIELECTRIC THICKNESS

This application is a continuation of application Ser. No. 08/000,440, filed Jan. 4, 1993, now abandoned.

BACKGROUND OF THE INVENTION

1. Field of the Invention

The present invention is generally directed to fabrication of semiconductor devices, and more particularly, to a resultant structure and a process for making an array of transistors and capacitors using double poly complementary metal oxide semiconductor (MOS) technology wherein the thickness of an interpolysilicon oxide layer can be independently adjusted relative to the thickness of gate oxide in a transistor.

2. State of the Art

Double poly MOS technology has been used widely in the design of analog circuits. The advantages of this technology include speed and the virtual elimination of any requirement for standby power.

Methods for fabricating double poly MOS transistors and capacitors are well known in the art. For example, FIGS. 1-5 illustrate typical fabrication steps. FIG. 1 illustrates a semiconductor substrate 10 with an oxide layer formed thereon. The oxide layer includes thick field oxide regions 11 and a thin oxide region 12. A polysilicon layer 14 is formed (e.g., deposited) on substrate 10 over the oxide layer as illustrated in FIG. 2. A photoresist layer 16 is then formed (e.g., coated) on the polysilicon layer 14. The photoresist layer is patterned (e.g., photolithographically) into a mask 16 and used to pattern (i.e., etch) portions of the polysilicon layer in known fashion to form a polysilicon region from layer 14 as illustrated in FIG. 3. The photoresist mask 16 is then removed after which the substrate 10 is dip etched to remove portions of the exposed oxide layer, with entire oxide region 12 being etched as illustrated in FIG. 4. Another oxide layer is then formed (e.g., grown) on substrate 10 to form a gate oxide layer 13 and also an interpolysilicon (i.e., interpoly) oxide layer 18 on top of polysilicon layer 14, as shown in FIG. 5. A second polysilicon layer is formed (e.g., deposited) on substrate 10 and etched to produce a patterned polysilicon layer 20 on top of the gate oxide 13 and a patterned polysilicon top plate 21 on the interpoly oxide layer 18 as shown in FIG. 6. The polysilicon of layer region 14 (representing a bottom plate), the interpoly oxide 18, and the top plate 21 form a capacitor. The polysilicon 20 forms a MOS transistor gate.

Either of the two polysilicon layers (e.g., the layers used to form regions 14 and 21, respectively) formed in the MOS fabrication process described above can be used as a transistor gate. The decision to use the first polysilicon layer or the second polysilicon layer as a transistor gate depends upon the characteristics required for the transistor. There are several disadvantages in selecting the first polysilicon layer as the transistor gate. First, characteristics of the first polysilicon layer can be degraded during the process of growing the interpoly oxide layer on top of the first polysilicon layer. More particularly, the growth of a good interpoly oxide layer requires that the process be conducted at a very high temperature. However, the transistor characteristics are changed by the high temperatures used during the oxide layer formation. Instead of using a high temperature process, a low temperature deposited oxide can be used. However, the quality of low temperature deposited oxide is generally inferior relative to thermally grown oxide. Hence, poor gate and interpoly oxide quality would result.

Using the process of FIGS. 1-6, the interpoly oxide layer 18 is formed at the same time the gate oxide layer 13 is formed. Therefore, the thickness of the interpoly oxide layer cannot be randomly changed without changing the thickness of the gate oxide layer. This seriously limits the porting of existing designs to different MOS processes used in different foundries.

SUMMARY OF THE INVENTION

It is an object of the present invention to overcome the problems described above by providing a MOS transistor and a method for MOS transistor fabrication which allows for independent adjustment of an interpoly oxide layer without affecting the thickness of a gate oxide layer. In an exemplary embodiment, an interpoly oxide layer is formed by first and second oxide formations, while the gate oxide layer is formed by only the second oxide formation. Therefore, the thickness of the interpoly oxide layer can be adjusted by increasing or decreasing the thickness of the first oxide formation without changing the thickness of the gate oxide layer.

More particularly, the invention relates to a resulting MOS structure and to an exemplary method for making a MOS structure which includes steps of forming a first layer of polysilicon over a substrate; forming a first oxide layer as an interpoly oxide over at least a portion of said polysilicon layer; and forming a second oxide layer over at least a portion of the substrate and first oxide layer to establish a gate oxide in an active region of the transistor. The first oxide layer is not limited to thermal oxide; rather, any dielectric which serves as insulation layer between the polysilicon capacitor plates can be used, including thermal oxide, deposit oxide, oxide-nitride, or oxide-nitride-oxide.

BRIEF DESCRIPTION OF THE DRAWINGS

Other features and advantages of the present invention will become more apparent when reading the following detailed description in conjunction with the drawings, wherein like elements, have been designated by like reference numerals, and wherein.

DETAILED DESCRIPTION OF THE PREFERRED EMBODIMENTS

Figure 1:
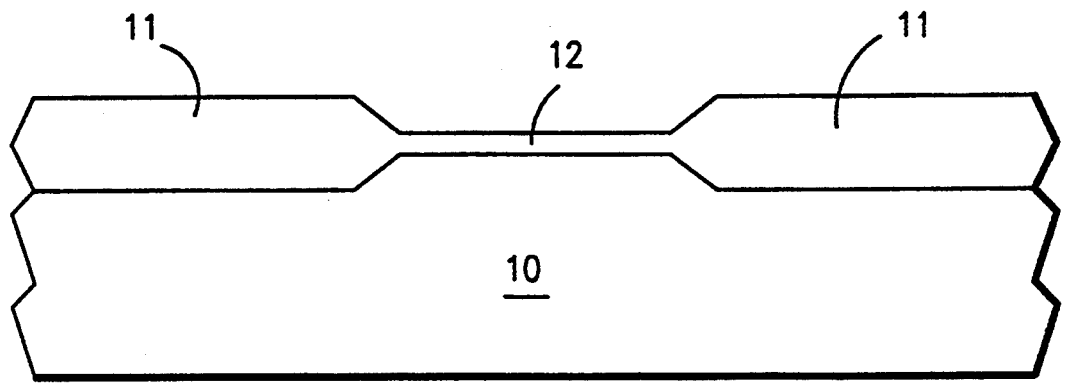
FIGS. 1-6 are sectional views illustrating a conventional process for fabricating a double poly MOS structure.
Figure 2:
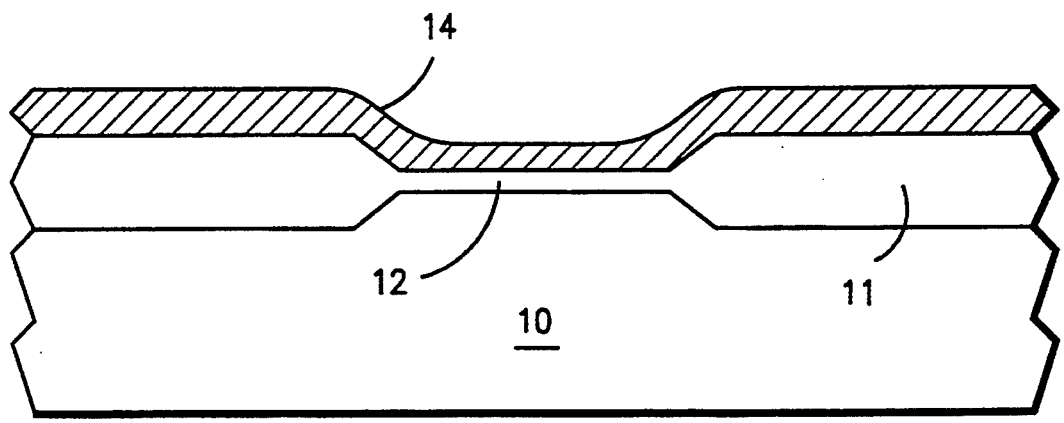
Figure 3:
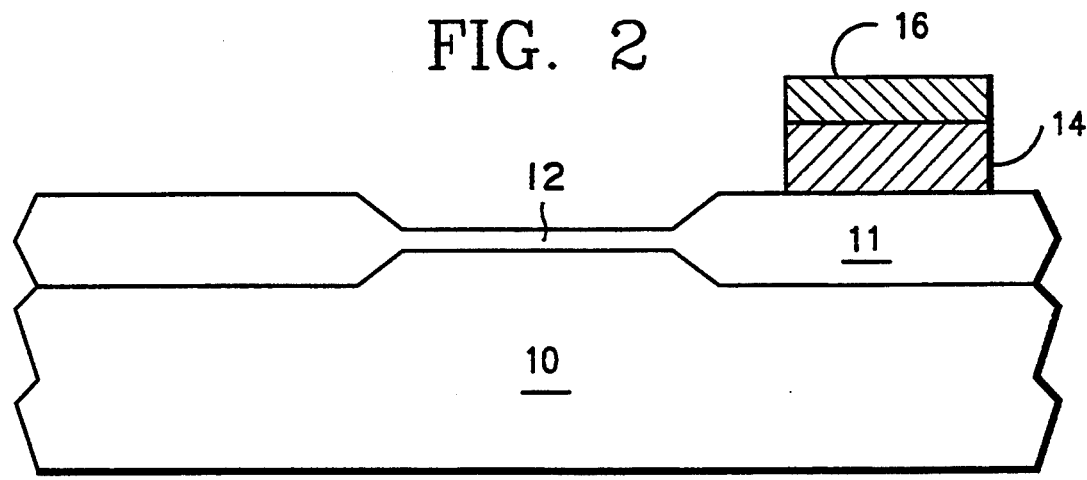
Figure 4:
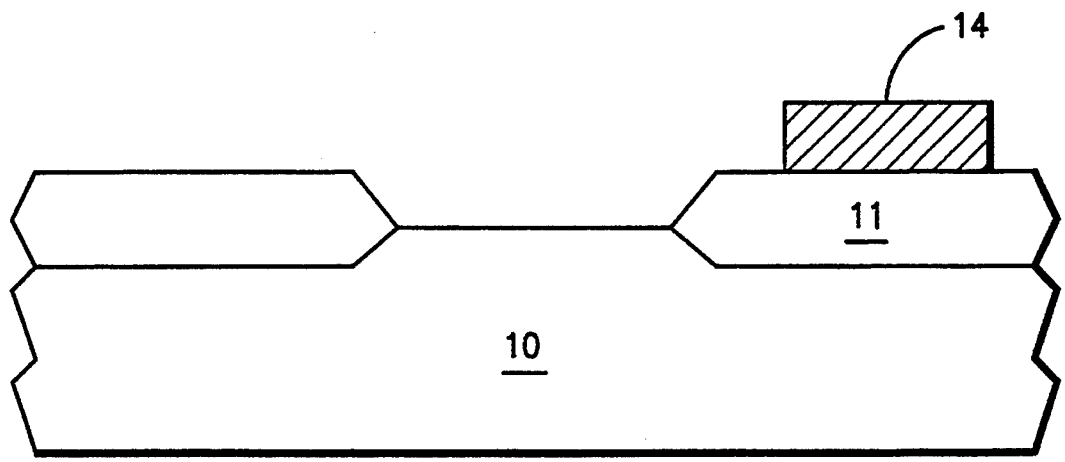
Figure 5:
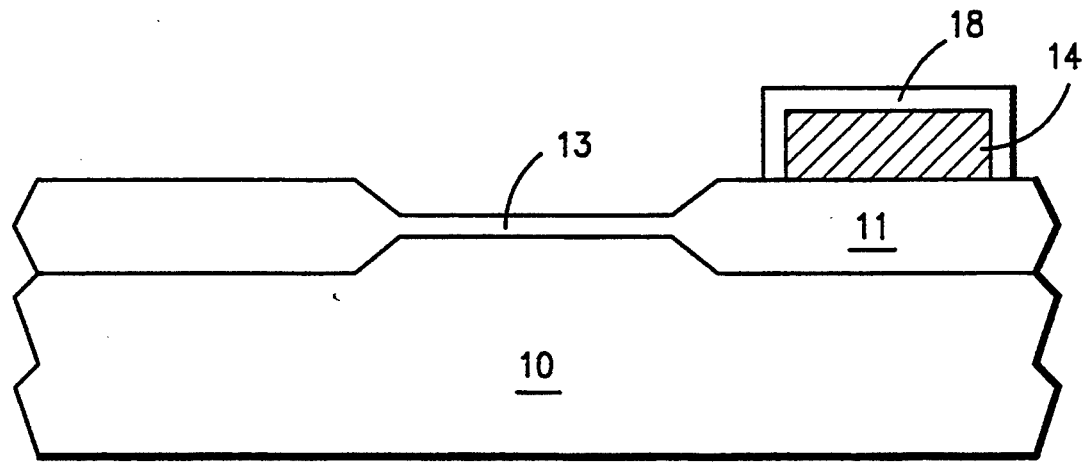
Figure 6:
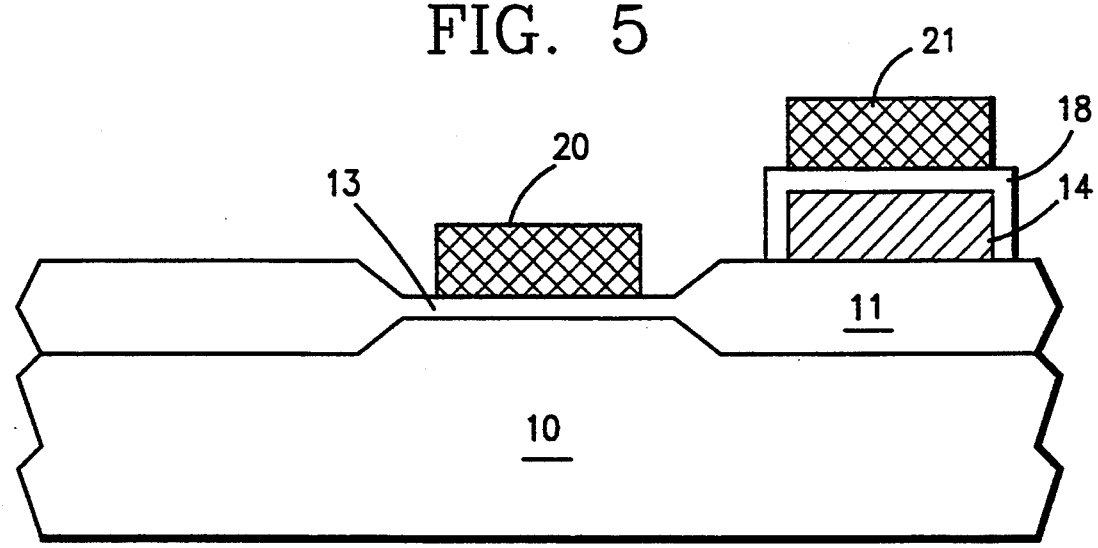
Figure 7:
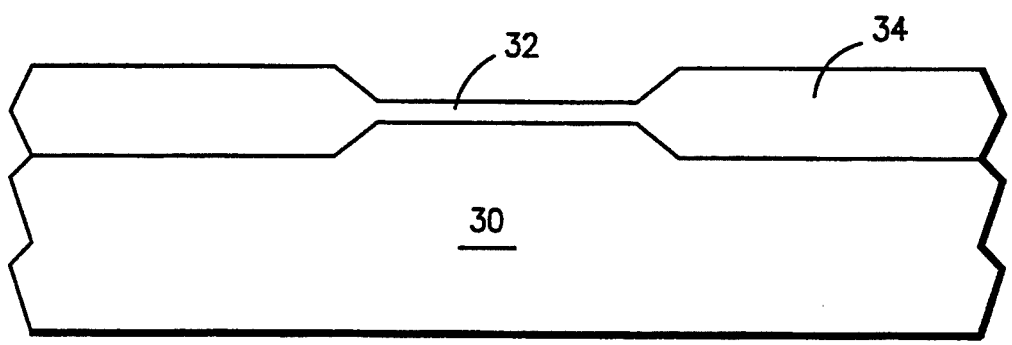
FIGS. 7-14 are sectional views illustrating an exemplary double poly MOS fabrication process and exemplary resulting structure in accordance with the present invention.
Figure 8:
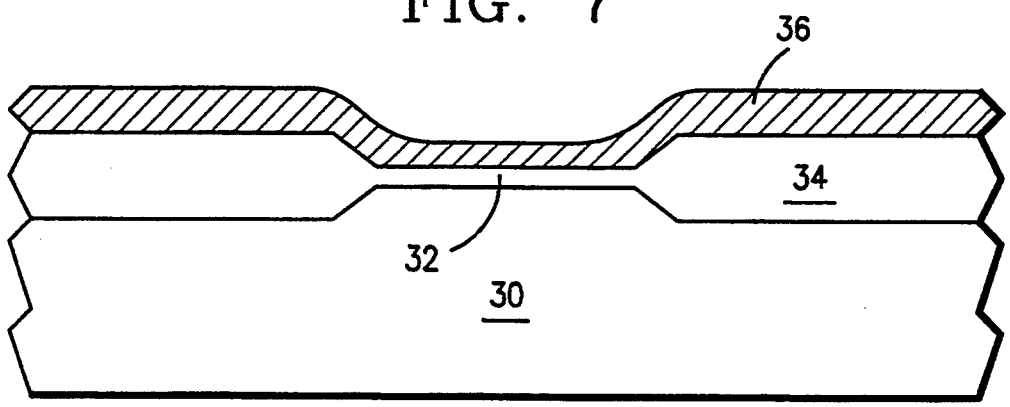

FIGS. 7 and 8 illustrate sectional views of an exemplary double poly MOS fabrication process and structure during successive steps which are similar to the process of FIGS. 1 and 2. FIGS. 9-14 illustrate sectional views of the double poly MOS fabrication process and structure during later stages of the exemplary process.

More particularly, FIG. 7 illustrates a semiconductor substrate 30. The substrate includes a field oxide layer having a thick field oxide region 34 and thin oxide region 32 over an active area of a transistor. A first polysilicon layer 36 is formed (e.g., deposited) on the oxidized semiconductor substrate 30, as illustrated in FIG. 8. The polysilicon layer can be deposited by methods well known in the art.

Figure 9:
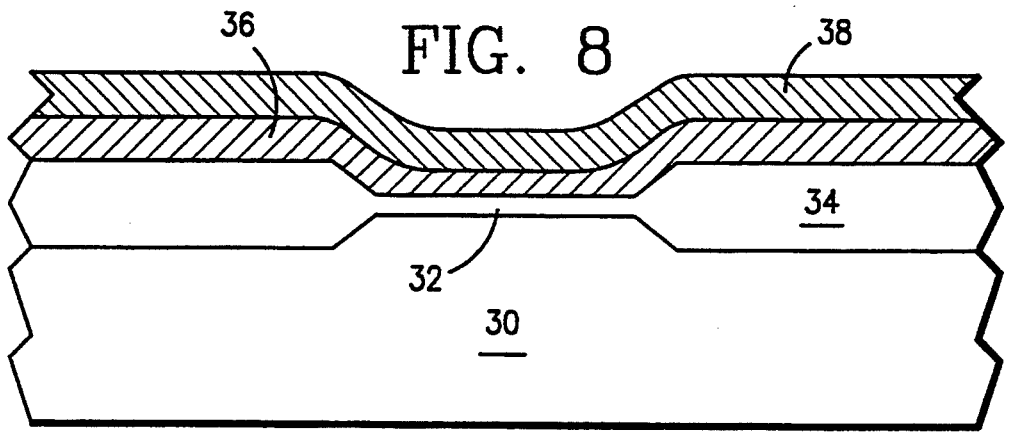
Figure 10:
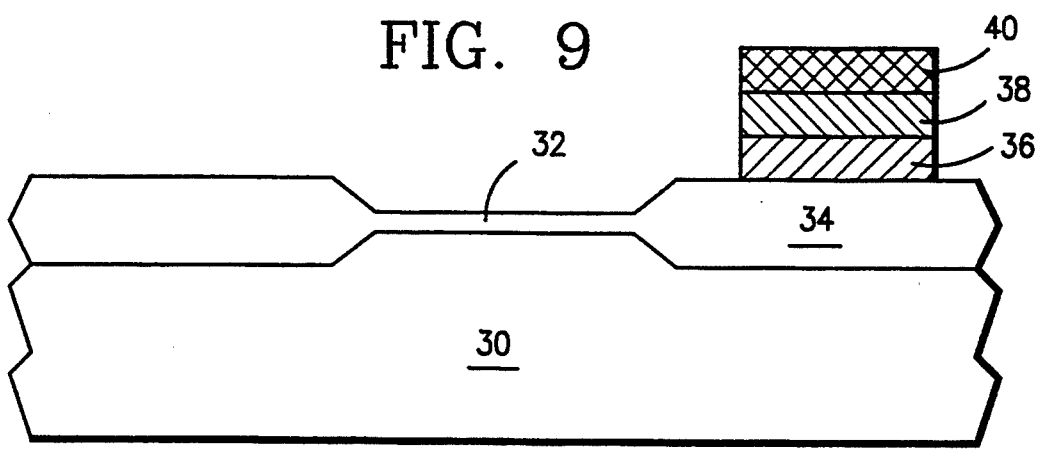

As illustrated in FIG. 9, a first oxide layer 38 is formed (e.g., grown or deposited) on top of the polysilicon layer 36. The first oxide layer can, for example, be formed of silicon dioxide and can be deposited by chemical vapor deposition (CVD), or thermally grown. In either case, the oxide material can be formed at a very high temperature. The first oxide layer is not limited to thermal oxide; rather, any dielectric which can serve as an insulation layer between the polysilicon capacitor plates can be used, including thermal oxide, deposit oxide, oxide-nitride, or oxide-nitride-oxide. A photoresist is formed (e.g., deposited) using techniques known in the art. The photoresist is then patterned into an exemplary mask 40 using, for example, a conventional photolithographic technique. The first oxide layer exposed by mask 40 is then selectively removed with, for example a wet etch. In an exemplary embodiment, this etch is followed in sequence by a dry plasma etch of the polysilicon layer, using the same patterned photoresist 40 as a mask. FIG. 10 illustrates a result of the foregoing steps, whereby a portion of the polysilicon layer 36 and a portion of the oxide layer 38 remain on the substrate 30 under the photoresist mask 40.

Figure 11:
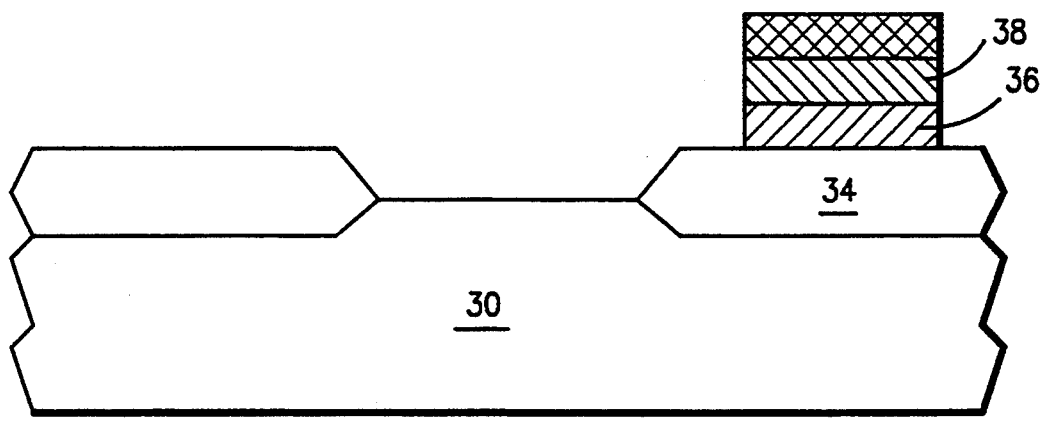
Figure 12:
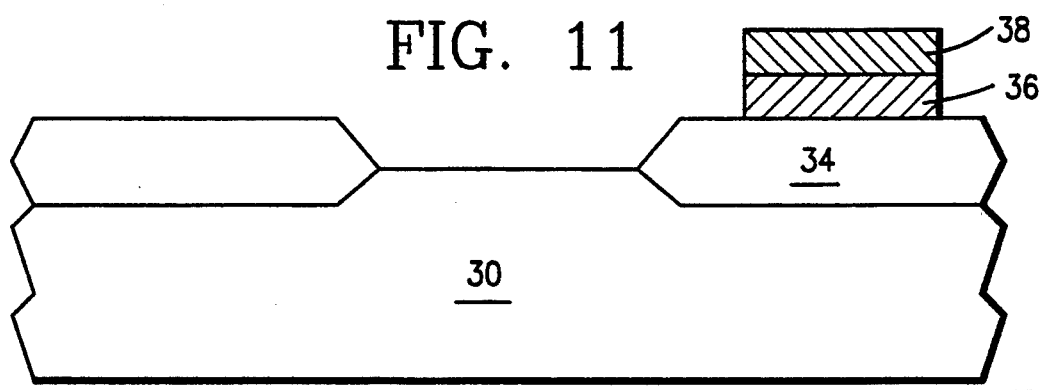
Figure 13:
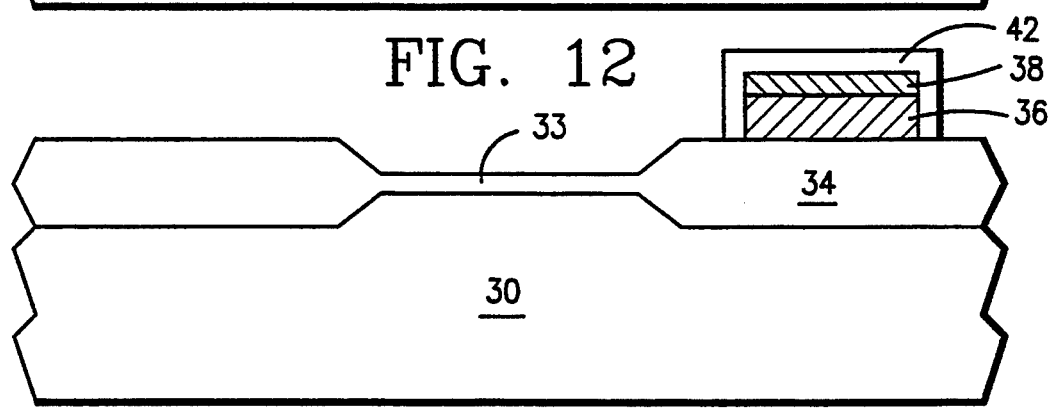

The semiconductor substrate 30 can next be subjected to a second wet etch (or dip etch) which removes portions of the exposed field oxide and the thin gate oxide layer 32 as illustrated in FIG. 11. The photoresist mask 40 is then removed (FIG. 12) and a second oxide layer is formed (e.g., grown or deposited) with uniform thickness over substrate 30 to form a gate oxide region 33 in an active region of the transistor, as illustrated in FIG. 13. The gate oxide layer 33 can be formed with a desired thickness. As the gate oxide region 33 is formed, an additional interpoly oxide layer 42 can be formed over remaining portion of the polysilicon layer 36, such that the interpoly oxide can have a greater thickness than the gate oxide layer 33, i.e., the interpoly oxide layer is formed by portions of the first and second oxide layers 38 and 42. As a result, the thickness of the interpoly oxide layer can be adjusted independently of the gate oxide by changing the thickness of the first oxide layer 38 at the time it is formed in FIG. 9, without affecting desired gate oxide layer thickness.

Figure 14:
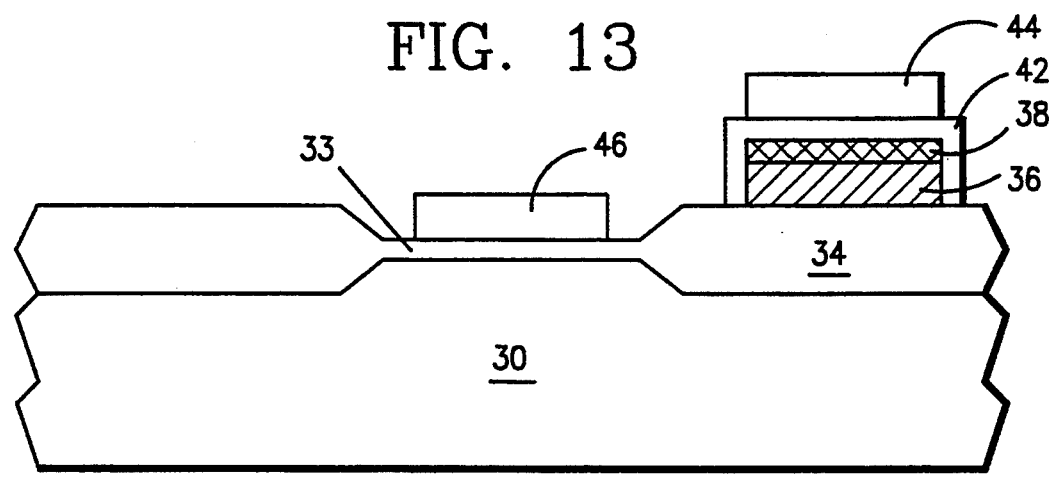

As illustrated in FIG. 14, a second patterned polysilicon layer can be formed (e.g., deposited) on top of the semiconductor substrate 30. The patterning of the second polysilicon layer 46, for example, can be done with a photoresist mask which is formed (e.g., deposited) and photolithographically patterned to mask portions 44 and 46 of the second polysilicon layer. The polysilicon layer not protected by the photoresist mask can be removed by a dry plasma etch after which the photoresist mask can be removed. The resulting structure is a semiconductor transistor and a polysilicon capacitor which has an interpoly oxide layer thickness that can be independently adjusted without affecting the thickness and desired characteristics of the gate oxide.

It will be appreciated by those skilled in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed:

1. A method for making a complementary metal oxide semiconductor (MOS) structure which includes at least one transistor and at least one capacitor comprising the steps of:
    forming a first layer of polysilicon over a substrate;
    forming a first oxide layer over said polysilicon layer;
    masking a portion of said first oxide layer and said first polysilicon layer, and removing unmasked portions of said first oxide layer and said first polysilicon layer to form a capacitor dielectric and a first capacitor plate; and
    forming a second oxide layer to increase the thickness of said capacitor dielectric and to establish a gate oxide in an active region of the at least one transistor.

2. A method as set forth in claim 1, further including the steps of:
    masking said portion of said first oxide layer with a photoresist layer; and
    removing portions of the first oxide layer and the polysilicon layer which are not covered by the photoresist layer prior to said step of forming said second oxide layer.

3. A method as set forth in claim 2, further including steps of:
    forming a second polysilicon layer over said substrate; and
    patterning portions of said second polysilicon layer with a second photoresist layer to establish a gate polysilicon region over said gate oxide and to establish a second capacitor plate over said capacitor dielectric.

4. A method as set forth in claim 2, further including steps of
    forming a field oxide layer on said substrate prior to forming said first oxide layer; and
    removing portions of the field oxide layer in the active region which are not covered by the photoresist layer prior to said step of forming said second oxide layer.

5. A method as set forth in claim 4, wherein said first oxide layer is thermal oxide.

6. A method as set forth in claim 4, wherein said portions of the field oxide layer in the active region are removed by wet etching.

7. A method as set forth in claim 4, wherein portions of said first oxide layer are removed by photolithography.

8. A method as set forth in claim 4, wherein said first and second oxide layers are thermally grown.

9. A method as set forth in claim 4, wherein said first and second oxide layers are formed through chemical vapor deposition.

10. A method as set forth in claim 1, further including the step of:
    forming said at least one capacitor using said portion of said polysilicon layer as a capacitor plate.

11. A method of making a complementary metal oxide semiconductor (MOS) structure comprising the steps of:
    forming a first layer of polysilicon on a substrate;
    forming a first oxide layer over said polysilicon layer;
    masking a portion of said first oxide layer and said first polysilicon layer;

removing unmasked portions of the first oxide layer and said first polysilicon layer to form a capacitor dielectric and a first capacitor plate;

forming a second oxide layer to increase the thickness of said dielectric and to establish a gate oxide in an active transistor region of said substrate; and patterning a second polysilicon layer over at least a portion of said second oxide layer.

12. A method as set forth in claim 11, wherein said first and second oxide layers are formed of silicon dioxide.

13. A method as set forth in claim 11, wherein said structure includes at least one transistor and at least one capacitor, said method further including the step of:

forming said at least one capacitor using said portion of said polysilicon layer as said first capacitor plate.

14. A method as set forth in claim 11, further including the steps of:

masking said portion of said first oxide layer with a photoresist layer; and removing portions of the first oxide layer and the polysilicon layer which are not covered by the photoresist layer prior to said step of forming said second oxide layer.

15. A method for making a complementary metal oxide semiconductor (MOS) structure which includes at least one transistor and at least one capacitor comprising the steps of:

forming a first oxide layer over an active gate region of a substrate where a transistor gate is to be formed;

forming a first layer of polysilicon over said first oxide layer;

forming a second oxide layer over said polysilicon layer;

masking a portion of said second oxide layer with a mask to pattern said polysilicon layer and to pattern said second oxide layer as an interpoly oxide over at least a portion of said polysilicon layer, said interpoly oxide being used as a capacitor dielectric;

removing said first oxide layer over said active gate region prior to removing said mask; and forming a third oxide layer to increase a thickness of said capacitor dielectric and to establish a gate oxide in said active gate region of the at least one transistor.

16. A method as set forth in claim 15, further including the steps of:

masking said portion of said second oxide layer with a photoresist layer; and removing portions of the first and second oxide layers and the polysilicon layer which are not covered by the photoresist layer prior to said step of forming said third oxide layer.

17. A method as set forth in claim 16, further including steps of:

forming a second polysilicon layer over said substrate; and patterning portions of said second polysilicon layer with a second photoresist layer to establish a gate polysilicon region over said gate oxide and to establish a second capacitor plate over said capacitor dielectric of increased thickness.

18. A method as set forth in claim 16, further including steps of forming a field oxide layer on said substrate prior to forming said second oxide layer.

* * * * *